(12) United States Patent
Xu et al.

(10) Patent No.: US 6,513,694 B1
(45) Date of Patent: Feb. 4, 2003

(54) SEMICONDUCTOR WAFER CLEAVING METHOD AND APPARATUS

(75) Inventors: Jie Xu, Tokyo (JP); Kenji Suzuki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 281 days.

(21) Appl. No.: 09/634,963

(22) Filed: Aug. 8, 2000

Related U.S. Application Data

(62) Division of application No. 09/403,732, filed as application No. PCT/JP99/01188 on Mar. 11, 1999.

(30) Foreign Application Priority Data

Mar. 12, 1998 (JP) .............................. 10-80320

(51) Int. Cl.$^7$ ............................. H01L 21/78; B26F 3/00
(52) U.S. Cl. .................... 225/96.5; 225/101; 125/23.01
(58) Field of Search .......................... 225/96.5, 2, 100, 225/101, 103, 104, 105, 96; 125/13.01, 12, 23.01

(56) References Cited

U.S. PATENT DOCUMENTS

| | | | | |
|---|---|---|---|---|
| 2,756,545 A | * | 7/1956 | Atkeson | 225/2 |
| 3,300,112 A | * | 1/1967 | Tailleur et al. | 225/96.5 X |
| 3,454,219 A | * | 7/1969 | Curtze et al. | 225/2 X |
| 3,497,948 A | * | 3/1970 | Wiesler et al. | 225/2 X |
| 3,687,345 A | * | 8/1972 | Carlson et al. | 225/96.5 X |
| 3,709,414 A | * | 1/1973 | Dahlberg et al. | 225/2 |
| 3,790,051 A | * | 2/1974 | Moore | 225/103 X |
| 3,964,655 A | * | 6/1976 | Kotaro | 225/105 X |
| 3,999,694 A | * | 12/1976 | Vossen | 225/100 |
| 4,049,167 A | * | 9/1977 | Guissard | 225/96.5 X |
| 4,088,255 A | * | 5/1978 | DeTorre | 225/96.5 X |
| 4,109,841 A | * | 8/1978 | DeTorre | 225/96.5 |
| 4,471,895 A | * | 9/1984 | Lisec, Jr. | 225/96.5 X |
| 4,498,451 A | * | 2/1985 | Beltz et al. | 125/23.01 |

(List continued on next page.)

FOREIGN PATENT DOCUMENTS

| | | | |
|---|---|---|---|
| DE | 3841484 A1 | * | 6/1990 |
| EP | 057521 A1 | * | 1/1994 |
| JP | 1-133704 | | 5/1989 |
| JP | 01-252395 | * | 10/1989 |
| JP | 02-016000 | * | 1/1990 |
| JP | 02-036094 | * | 2/1990 |
| JP | 05-057698 | * | 3/1993 |
| JP | 8-124878 | | 5/1996 |

*Primary Examiner*—Charles Goodman
(74) *Attorney, Agent, or Firm*—Lacasse & Associates, L.L.C.

(57) ABSTRACT

The invention provides a semiconductor wafer cleaving method and apparatus which are used to obtain an ideal vertical cleaved plane of semiconductor wafers. A semiconductor wafer (1) having a scribing mark (2) inscribed on the surface is set on fulcrum members (6a and 6b). The fulcrum members (6a and 6b) are left-right symmetrical centering around the scribing mark (2) and parallel to the scribing mark (2). Fulcrum members (4a and 4b) are disposed left-right symmetrically centering around the scribing mark (2) and in parallel to the scribing mark (2) on the upper side of the semiconductor wafer (1). The fulcrum members (4a and 4b) are disposed outside the fulcrum members (6a and 6b). Load is applied from the fulcrum members (4a and 4b) side, wherein fulcrum forces are caused to operate from the respective fulcrum members (4a, 4b, 6a and 6b) onto the semiconductor wafer (1). A shearing force becomes zero in an area of the semiconductor wafer (1) between the fulcrum members (6a and 6b), wherein the maximum main stress of bending tension is actuated in a direction orthogonal to the perpendicular plane of the scribing mark (2), thereby cleaving the semiconductor wafer (1).

3 Claims, 11 Drawing Sheets

U.S. PATENT DOCUMENTS

| | | | | |
|---|---|---|---|---|
| 4,653,680 A | * | 3/1987 | Regan | 225/104 X |
| 4,948,025 A | * | 8/1990 | Lisec | 225/104 X |
| 5,069,195 A | * | 12/1991 | Barozzi | 225/96.5 X |
| 5,154,333 A | * | 10/1992 | Bauer et al. | 225/96.5 X |
| 5,174,188 A | * | 12/1992 | Petroz | 225/96 X |
| 5,303,861 A | * | 4/1994 | Allaire et al. | 225/103 X |
| 5,398,857 A | * | 3/1995 | Shinozaki et al. | 225/96.5 X |
| 5,458,269 A | * | 10/1995 | Loomis | 225/96.5 X |
| 5,740,953 A | * | 4/1998 | Smith et al. | 225/2 |
| 5,820,006 A | * | 10/1998 | Turner | 225/96 |
| 5,927,582 A | * | 7/1999 | Duecker | 225/96.5 X |
| 6,171,933 B1 | * | 1/2001 | Xu et al. | 438/462 |

* cited by examiner

Prior Art

Prior Art

SEMICONDUCTOR WAFER CLEAVING METHOD AND APPARATUS

This application is a divisional application of U.S. patent application Ser. No. 09/403,732 filed Oct. 26, 1999 which is a 371 of PCT/JP99/0118 filed Mar. 11, 1999.

TECHNICAL FIELD

The present invention relates to a semiconductor wafer cleaving method and apparatus by which semiconductor wafers are cleaved along scribing marks.

BACKGROUND ARTS

Since priorly, various types of semiconductor chips have been obtained by cutting off a plurality of element areas formed and arrayed on a semiconductor wafer at boundary positions. Recently, the cutting of semiconductor wafers is carried out by, for example, cleaving the wafers along scribing marks with the scribing marks provided at boundary positions of the element formed areas at the end edge on the surface of the semiconductor wafers.

FIG. 11 and FIG. 12 show a conventionally general method for cleaving semiconductor wafers. The cleaving method is called a "three-point bending method." First, a plurality of scribing marks 2 are arrayed and formed at the end edge on the surface of a semiconductor wafer 1 (These scribing marks 2 are provided at the boundary positions of the element formed areas on a semiconductor wafer 1). Next, a pair of fulcrum members 4a and 4b are disposed in parallel to the scribing marks 2 with each of the scribing marks 2 placed therebetween on the surface 3 where the scribing marks are formed. Also, on the rear side 5 opposite the scribing mark formed surface, a fulcrum member 6 is disposed so as to become parallel to each of the scribing marks 2, at the position opposed to the above scribing marks 2. After that, a tensile force is given to the scribing marks 2 by causing fulcrum forces P2, P1, and F1 to operate thereon from these fulcrum members 4a, 4b and 6, whereby the semiconductor wafer 1 is cleaved at the plane ZOY from the position of the scribing marks 2.

The relationship between a shearing force and a bending moment in carrying out a cleaving by the "three-point bending method" is expressed as shown in FIG. 13. As shown in FIG. 13, the positive or negative polarity of the shearing force is reversed at the lower fulcrum member 6 used as the boundary. In fact, the operating point of a fulcrum force F1 acting from the fulcrum member 6 on the semiconductor wafer 1 has a definite width although being slight. Therefore, the shearing stress does not become zero in the entirety of the operating area of the fulcrum force F1. As shown in FIG. 12, a portion of a minute cubic volume dva of one-sided half of the scribing mark is taken for instance, wherein a shearing stress $\tau$ parallel to the plane ZOY to be cleaved, and a bending tensile stress $\sigma_{ax}$ perpendicular to the plane ZOY to be cleaved are produced.

If the shearing stress and bending tensile force are expressed in terms of Mohr's stress circle, they will become as shown in FIG. 14. That is, the direction of action of the ruling maximum main stress $\sigma_{a1}$ of cleavage produced on the cleavage plane of the scribing mark is not a direction $\sigma_{ax}$ perpendicular to the vertical cleavage plane (plane ZOY) ideal to the semiconductor wafer 1, but has an angle $\alpha 1$ from the direction $\sigma_{ax}$, (which can be easily calculated by Mohr's stress circle). Therefore, as in the cleavage plane of a cleavage state illustrated in FIG. 15, an oblique cleaved portion 7a is produced at the portion at the lower side of the scribing mark 2 on the cleavage plane 7 of the semiconductor wafer 1, whereby such a problem arises, by which an expected cleavage plane could not reliably be obtained.

In addition, as shown in FIG. 16, when actually carrying out a cleaving work, the fulcrum member 6 does not become parallel to the scribing marks 2, whereby a possibility exists, that the fulcrum member 6 is disposed so as to cross the extension line of the scribing marks 2. In such cases, a problem arises, by which a cleavage plane 7 bent as shown in FIG. 17 would be produced.

The present invention was developed in order to solve the above shortcomings and problems, and it is therefore an object of the invention to make the shearing stress zero in the vicinity of the scribing marks, and to make the direction of the maximum main stress produced in the scribing mark perpendicular to the ideal vertical cleavage direction. That is, the invention is to provide a semiconductor wafer cleaving method and apparatus which enables an ideal mirror-finished cleavage plane by operating only the bending tensile stress onto scribing marks.

DISCLOSURE OF THE INVENTION

The invention is constructed as described below. That is, a first aspect of a semiconductor wafer cleaving method according to the invention is constructed so that the lower side of a semiconductor wafer, which has a scribing mark inscribed on the surface, is supported by fulcrum members in parallel to the above scribing mark at least two or more positions between which the scribing mark is placed, and similarly, the upper side of the semiconductor wafer is supported by fulcrum members in parallel to the above scribing mark in at least two or more positions, between which the scribing mark is placed, different from the positions where the scribing mark is supported so as to be placed at the innermost side on the lower side, a fulcrum force, which makes zero the shearing force of a semiconductor wafer between the fulcrum members supporting the innermost side with the scribing mark placed therebetween, is given from the respective fulcrum members at both upper side and lower side to the semiconductor wafer to cause pure bending tensile stress to operate onto the scribing mark, and the semiconductor wafer is cleaved at the scribing mark.

Further, a second aspect of the semiconductor wafer cleaving method according to the invention is constructed so that, in addition to the first aspect of the semiconductor wafer cleaving method, the fulcrum members at both upper side and lower side of the semiconductor wafer are placed left-right symmetrically, centering around a scribing mark, and a left-right symmetrical pair of fulcrum members which support at the innermost side the plane where the scribing mark is formed, are disposed outside the corresponding left-right symmetrical pair of fulcrum members which support at the innermost side the opposite back side.

Further, a third aspect of the semiconductor wafer cleaving method according to the invention is constructed so that, in addition to the first or second aspect of the semiconductor wafer cleaving method, one side of the upper side fulcrum members and the lower side fulcrum members of the semiconductor wafer are caused to move in a direction of applying a fulcrum force when applying a fulcrum force from the respective fulcrum members to the semiconductor wafer, the moving side fulcrum members are supported via a slide mechanism which self-adjusts the hypothetical plane connecting the fulcrum tip ends of the above moving side fulcrum members in parallel to the plane in which a fulcrum force of the semiconductor wafer is applied, and the slide mechanism causes the moving side fulcrum members while maintaining the parallel of the above hypothetical plane of the moving side fulcrum members with respect to the plane in which a fulcrum force of the semiconductor wafer is applied, whereby a fulcrum force is applied to the semiconductor wafer.

Also, a fourth aspect of the semiconductor wafer cleaving method according to the invention is constructed so that, in addition to the first, second or third construction of the semiconductor wafer cleaving method, a fulcrum force of a fixed load is applied from the upper side fulcrum members and the lower side fulcrum members of a semiconductor wafer.

Moreover, a fifth aspect of the semiconductor wafer cleaving method according to the invention is constructed so that, in addition to the first, second or third construction of the semiconductor wafer cleaving method, a fulcrum force applied from the above fulcrum members to a semiconductor wafer is a distributional load, the force of which is increased in the direction a crack generated along the scribing mark develops.

Further, a sixth aspect of the semiconductor wafer cleaving method according to the invention is constructed so that, in the construction of any one of the first through the fifth aspects of the semiconductor wafer cleaving method, a semiconductor wafer is cleaved with a damper member secured between the upper and lower respective fulcrum members on the upper side and lower side of the semiconductor wafer.

Moreover, a first aspect of a semiconductor wafer cleaving apparatus according to the invention comprises a wafer setting plane for placing and setting a semiconductor wafer which has scribing marks inscribed on the surface; a moving stage means which is capable of moving the semiconductor wafer set on the wafer setting plane in the X and Y directions of two planar axes, orthogonal to each other and a rotation direction around a Z axis perpendicular to the plane XY; lower side fulcrum members for supporting the lower side of the semiconductor wafer placed on the above wafer setting plane in parallel to the scribing mark in at least two or more positions in a state where the scribing mark is placed therebetween, upper side fulcrum members for supporting the upper side of the semiconductor wafer set on the above wafer setting plane in parallel to the above scribing mark in at least two or more positions different from a position to support the above scribing mark at the innermost side at the above lower side in a state where the scribing mark is placed therebetween; a dynamic load applying means for applying a moving load for giving a fulcrum force from at least one of both the above upper side and lower side fulcrum members to the semiconductor wafer; and an observing means provided with a camera for observing a supporting situation of the semiconductor wafer supported by both the above upper side and lower side fulcrum members; wherein a fulcrum force which makes zero a shearing force of the semiconductor wafer between the fulcrum members to support the innermost side with the scribing mark placed therebetween is applied from the respective fulcrum members at both the upper side and lower side to the semiconductor wafer, and pure bending tensile stress is caused to operate onto a scribing mark, whereby the above semiconductor wafer is cleaved on the basis of the above scribing mark.

Further, a second aspect of the semiconductor wafer cleaving apparatus according to the invention is characterized in that, in addition to the first construction of the semiconductor wafer cleaving apparatus, the respective fulcrum members in which a moving load is applied from the dynamic load applying means are connected to the above dynamic load applying means via a slide mechanism which self-adjusts the hypothetical plane, which connects the fulcrum tip ends of the semiconductor wafer of the above respective fulcrum members, in parallel to the plane where a fulcrum force of the semiconductor wafer is applied.

In the invention, fulcrum members are disposed at two or more positions between which a scribing mark is placed, on the scribing mark formed plane of a semiconductor wafer. Further, fulcrum members are also disposed at two or more positions, between which the scribing mark is placed, on the side opposite the scribing mark formed plane as in the above. Since a fulcrum force is applied from the respective fulcrum members, a shearing stress becomes zero at the area of the semiconductor wafer between the fulcrum members having the above scribing mark placed at the innermost side therebetween. Therefore, the maximum main stress of a bending tensile force is caused to act onto the scribing mark in a direction perpendicular to the ideal vertical cleaving plane, whereby the semiconductor wafer is cleaved along the ideal vertical cleaving plane at the position of the scribing mark. Therefore, the cleaved plane can be prevented from becoming oblique or being bent at both ends or at one side of the scribing mark, wherein it is possible to obtain an ideal mirror-finished vertical cleaved plane.

The invention brings the following effects. That is, the lower side of a semiconductor wafer, on which a scribing mark is inscribed is supported by fulcrum members at two or more positions between which the scribing mark is placed, and as in the above, the upper side of the semiconductor wafer is supported by fulcrum members at two or more positions between which the above scribing mark is placed, whereby a fulcrum force is applied from the fulcrum members so that the shearing force becomes zero at the areas of the semiconductor wafer between the fulcrum members which place the scribing mark at the innermost side therebetween, thereby causing the semiconductor wafer to be cleaved. The invention is constructed so that the semiconductor wafer is thus cleaved. Therefore, the semiconductor wafer can be cleaved by causing only pure tensile stress of the maximum main stress to operate in a direction orthogonal to the perpendicular plane of the semiconductor wafer along the scribing mark.

Therefore, it is possible to obtain an ideal mirror-finished perpendicular cleaved plane which is straight along the scribing mark, wherein the cleavage quality can be remarkably improved. In addition, since the shearing stress can be made zero in the entire range between the fulcrum members at the innermost side, work for aligning the scribing mark to the range where the shearing stress is zero can be facilitated, wherein the efficiency of the cleaving work can be further improved.

Moreover, fulcrum members at both the upper side and lower side, which support a semiconductor wafer, are left-right symmetrically disposed, centering around the scribing mark, and a load is applied from one of either the upper side or the lower side or both to a semiconductor wafer on load applying planes parallel to both the upper side and lower side of the semiconductor wafer. Since the load is thus applied, the fulcrum force operating from the respective fulcrum members onto the semiconductor wafer is made equal, wherein the shearing force between the fulcrum members which support the innermost of the wafer necessarily becomes zero. Accordingly, it becomes very easy to adjust the shearing stress between the fulcrum members, between which the scribing mark is placed, to zero.

Further, since both the upper side and lower side of the semiconductor wafer are covered up with a damper means when cleaving the corresponding semiconductor wafer, the semiconductor wafer can be prevented from being impaired and damaged. In addition, it is possible to prevent the cleaved semiconductor wafers from being scattered.

In addition, since it is constructed so that the fulcrum members are connected to a dynamic load applying means via a slide mechanism, the hypothetical plane connecting the operating points of fulcrum forces of the respective fulcrum members is self-adjusted to become parallel to the operating plane of the fulcrum forces on the semiconductor wafer, wherein load is applied onto the fulcrum members. Therefore, such an effect can be obtained, by which load uniformly distributed to the respective fulcrum members can be applied from the dynamic load applying means.

Further, since it is constructed so that a fulcrum force in a distributional load pattern in which the force is gradually increased in line with the advancement of a crack is applied to the semiconductor wafer, the crack advancement speed can be accelerated at the scribing mark formed plane side. Thereby, when cleaving a semiconductor wafer in which a complex layer such as metallic plating, etc., is formed on the scribing mark formed plane, the cleaved plane can be prevented from becoming defective, and good quality and stabilized cleaved planes can be obtained.

BEST MODE FOR CARRYING OUT THE INVENTION

Figure 1:
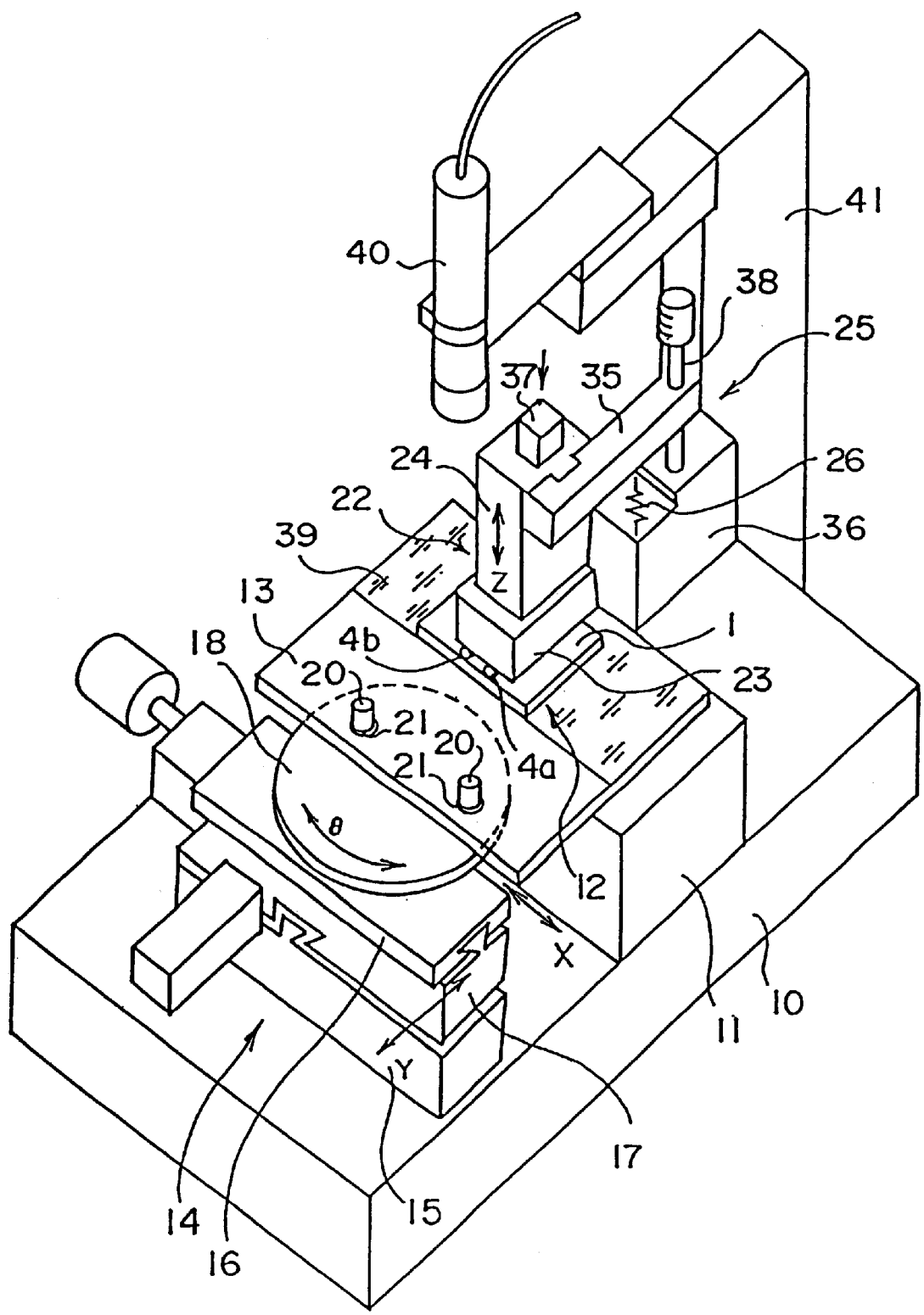
FIG. 1 is a configurational view of one preferred embodiment of a semiconductor wafer cleaving apparatus according to the invention.

In order to describe the invention in further detail, hereinafter, a description is given of one preferred embodiment of the invention with reference to the accompanying drawings. In the following description of the preferred embodiment, components which are identical to those in the prior art example are given the same reference numbers, and overlapping description thereof is omitted. FIG. 1 shows one preferred embodiment of a semiconductor wafer cleaving apparatus according to the invention.

Figure 2:
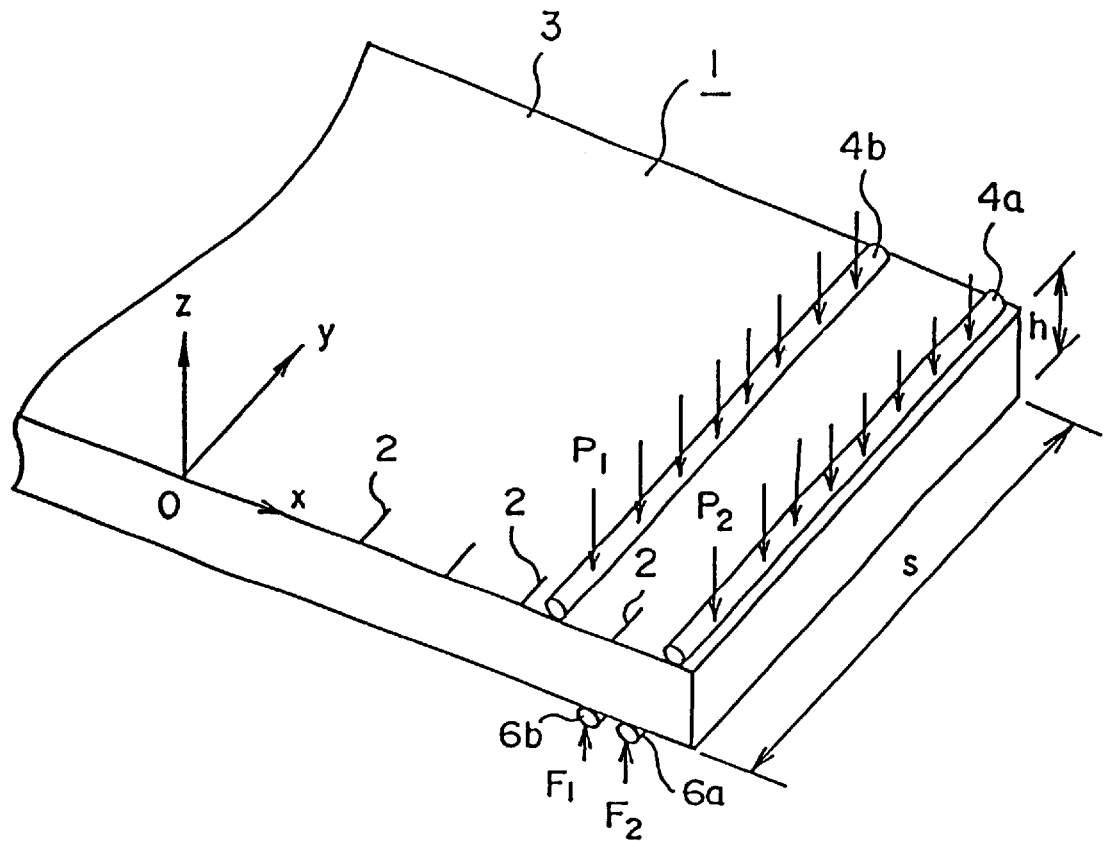
FIG. 2 is an explanatory view showing a "four-point bending method" of a semiconductor wafer cleaving method according to the preferred embodiment.

In FIG. 1, a support block 11 is provided on the upper surface of a platform 10, and a pair of circular rod-shaped (round bar-like) fulcrum members are provided with certain spacing on the upper side of the support block 11. As shown in FIG. 2, the pair of fulcrum members 6a and 6b are disposed and fixed with spacing. The interval between the fulcrum members 6a and 6b becomes an interval in which a scribing mark 2 secured on the surface of one end edge of a semiconductor wafer 1 set on the fulcrum members 6a and 6b is placed therebetween.

Accordingly, a wafer setting portion 12 is installed on the upper side of the support block 11. The wafer setting portion 12 has a wafer setting plate 13. An opening is formed in the wafer setting plate 13. The opening is capable of idly accommodating a semiconductor wafer 1 disposed on the upper side of the fulcrum members 6a and 6b. A damper member 39 such as a vinyl sheet is placed on the wafer setting plate 13 in such a form where the opening is covered, and the semiconductor wafer 1 is placed on the damper member 39. The semiconductor wafer 1 is placed in the opening of the wafer setting plate 13 and is finally placed on the fulcrum members 6a and 6b via the corresponding damper member 39. Further, although the upper side of the semiconductor wafer 1 may be covered up with a damper member 39, the damper member 39 for the upper side is not illustrated. In addition, the material (types) of the semiconductor wafer 1 is not limited, wherein not only glass wafers but also universal wafers made of various types of materials are applicable.

A moving stage means 14 is installed adjacent to the support block 11 on the upper side of the platform 10. The moving stage means 14 is composed of a table base 15, an X table 16, a Y table 17 and a θ table 18. The table base 15 is fixed on the platform 10. The Y table 17 is engaged with a projection of the table base 15 by utilizing a dovetail groove and can freely move in the Y direction of the two planar axes. As in the above, the X table 16 is engaged with a projection of the Y table 17 by utilizing a dovetail groove, and can freely move in the X direction of the two planar axes. In addition, the θ table 18 is installed so as to freely turn normally or reversely (θ turn) along the X and Y planes with respect to the X table 16.

Movement of the Y table 17 in the Y direction, movement of the X table 16 in the X direction, and turning of the θ table 18 are carried out by a control device (not illustrated), The θ table 18 is provided with engagement pins 20. The engagement pins 20 are engaged in engagement holes 21 secured on the wafer setting plate 13. Thus, by the engagement pins 20 of the θ table 18 being engaged in the engagement holes 21 of the wafer setting plate 13, a semiconductor wafer 1 set on the wafer setting plate 13 is caused to move in the X, Y and θ directions in compliance with the X, Y and θ movements of the moving stage means 14. That is, since the control device controls the moving stage means 14, the positioning of the semiconductor wafer 1 in the X, Y and θ directions is enabled.

Figure 3:
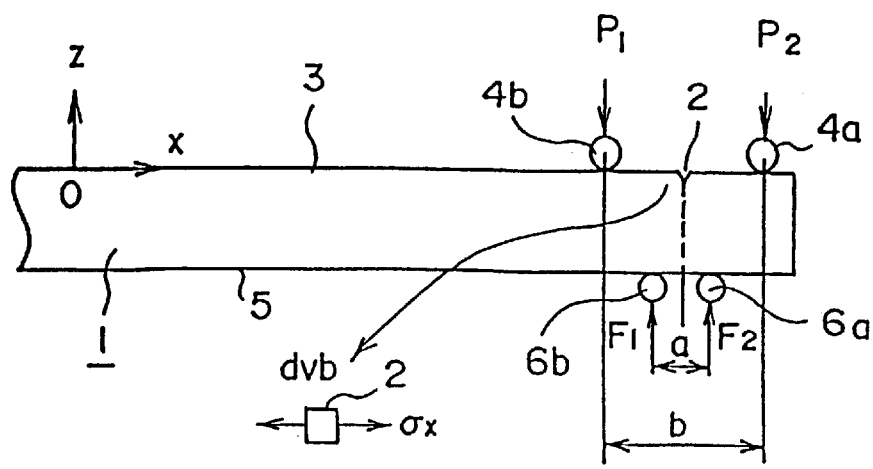
FIG. 3 is an explanatory view showing a portion of a scribing mark illustrated in FIG. 2 in a longitudinally sectional state.

A dynamic load applying means 22 is provided on the upper side of a semiconductor wafer 1 set on the wafer setting plate 13. The dynamic load applying means 22 is composed of a fulcrum member retaining portion 23, a load applying drive body 24, a stroke setting means 25, and a load cancelling spring 26. On the lower side of the fulcrum retaining portion 23, a pair of fulcrum members 4a and 4b are disposed and fixed, so that a scribing mark 2 of a semiconductor wafer 1 set on the lower side of the fulcrum members 4a and 4b is placed therebetween as shown in FIG. 2 and FIG. 3, in parallel to the corresponding scribing mark 2.

In the preferred embodiment, the upper side fulcrum members 4a and 4b represent a circular rod shape as in the lower side fulcrum members 6a and 6b. The disposition of the fulcrum members 4a and 4b is regulated as shown below. That is, the regulated position of disposing the fulcrum members 4a and 4b is a position where the fulcrum members 4a and 4b are placed outside the fulcrum members 6a and 6b and the scribing mark 2 is placed therebetween. The fulcrum member retaining portion 23 may be directly fixed on the lower side of the load applying drive body 24. However, in the preferred embodiment, the fulcrum member retaining portion 23 is coupled to the load applying drive body 24 via a slide mechanism.

Figure 7:
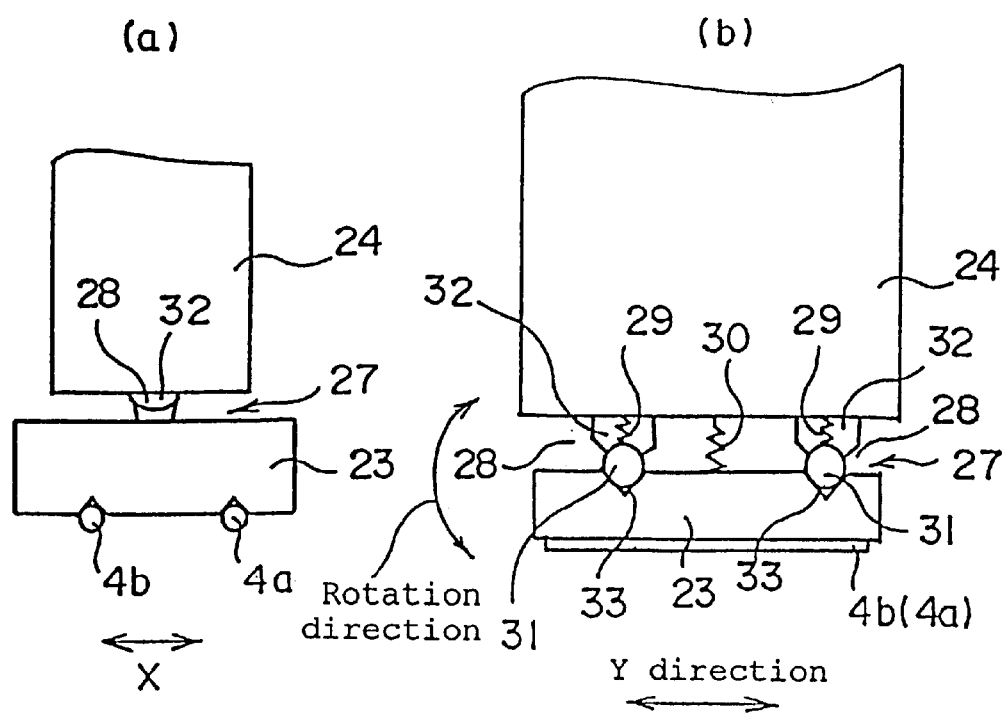
FIG. 7 is a view showing a slide mechanism in the preferred embodiment.

The slide mechanism may be constructed in various patterns. Some of the patterns are illustrated in FIG. 7 through FIG. 10. In these drawings, (a) is a view observed from the side, and (b) is a view observed from the front side. A slide mechanism 27 illustrated in FIG. 7 is composed of a ball plunger 28 and a tensioning spring 30, wherein the ball plunger 28 has a ball press-down spring 29, a ball 31 and a holder 32. That is, the ball 31 is provided at the tip end side of the holder 32 so as to freely rotate. The ball 31 is caused to protrude downward from the lower end ball receiving plane of the holder 32 by a compression type ball press-down spring 29 (The ball 31 is retained so that it does not drop from the holder 32). The holder 32 is screwed to the lower side of the load applying drive body 24 and fixed there.

A conical hole 33 is provided on the upper side of the fulcrum member retaining portion 23, which is opposite to the above ball 31, and the ball 31 is placed in the conical hole 33, and the ball 31 is brought into contact with the fulcrum member retaining portion 23. The tension spring 30 has one end thereof fixed at the load applying drive body 24 and the other end fixed at the fulcrum member retaining portion 23, and the tension spring 30 intervenes between the fulcrum member retaining portion 23 and the load applying drive body 24. The fulcrum member retaining portion 23 is pulled upward by a tensile strength of the tension spring 30 and is brought into pressure contact with the ball 31, wherein rotation in the direction of the arrow shown in FIG. 7(b) is enabled.

Figure 8:
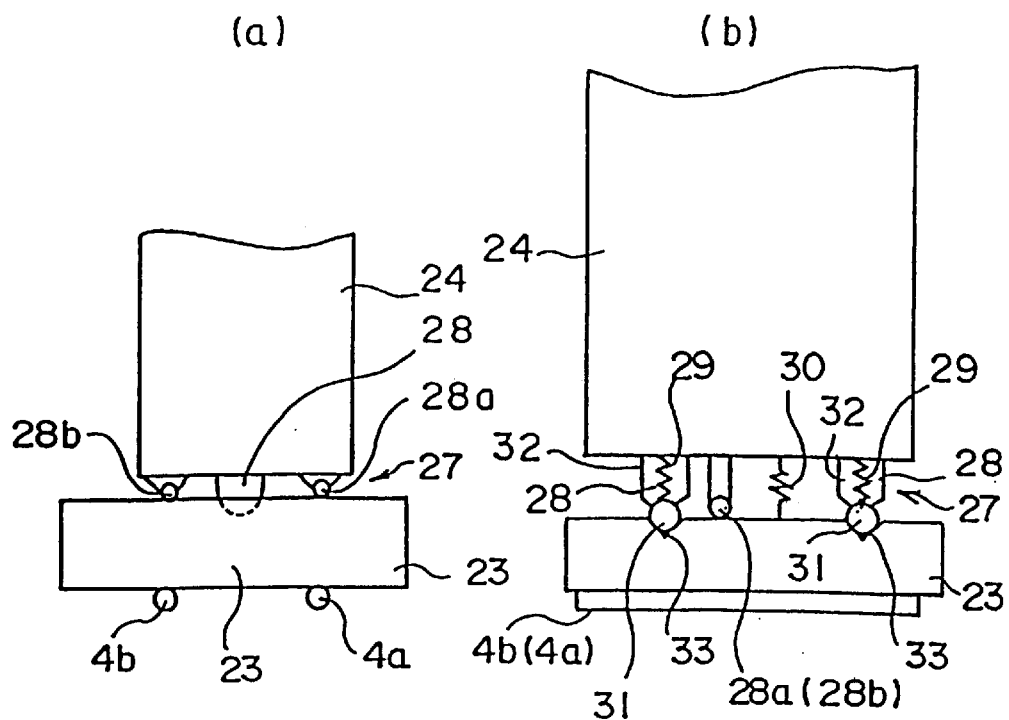
FIG. 8 is a view showing another preferred embodiment of the slide mechanism.

A slide mechanism illustrated in FIG. 8 shows that a pair of ball plungers 28a and 28b are further added to the slide mechanism shown in FIG. 7, and all other components are identical to those of the slide mechanism shown in FIG. 7. The ball plungers 28a and 28b are provided with spacing in a direction orthogonal to the direction of a straight line connecting a pair of ball plungers 28 along the fulcrum members 4a and 4b. These ball plungers 28, 28, 28a and 28b enables further accurate and horizontal supporting of the fulcrum retaining portion 23.

Figure 9:
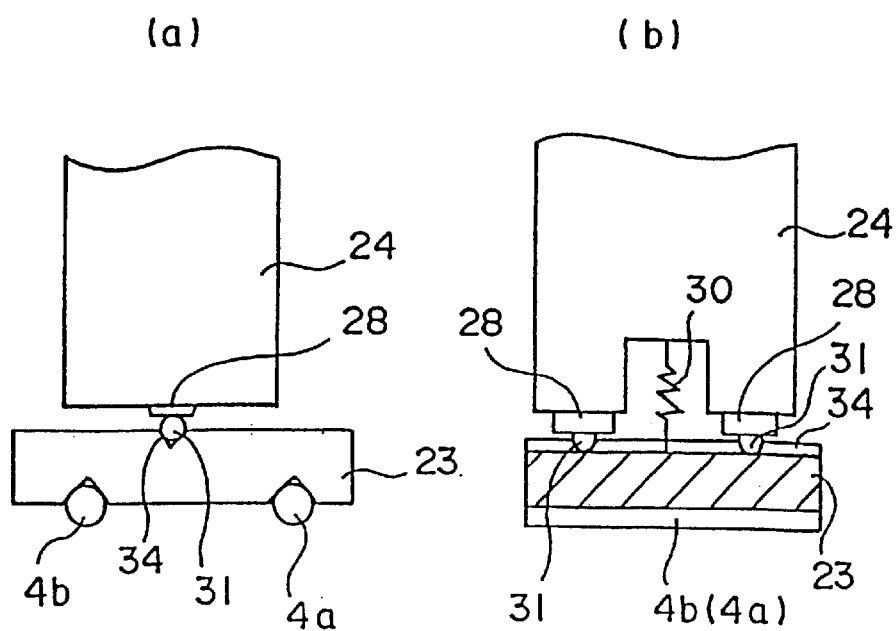
FIG. 9 is a view showing still another preferred embodiment of the slide mechanism.

A slide mechanism 27 illustrated in FIG. 9 is provided with a V-shaped groove 34 on the upper surface of the fulcrum member retaining portion 23 instead of being provided with conical holes thereon, and a ball 31 of the ball plunger 28 is placed in the V-shaped groove 34. All other components are identical to those of the mechanism illustrated in FIG. 7.

Figure 10:
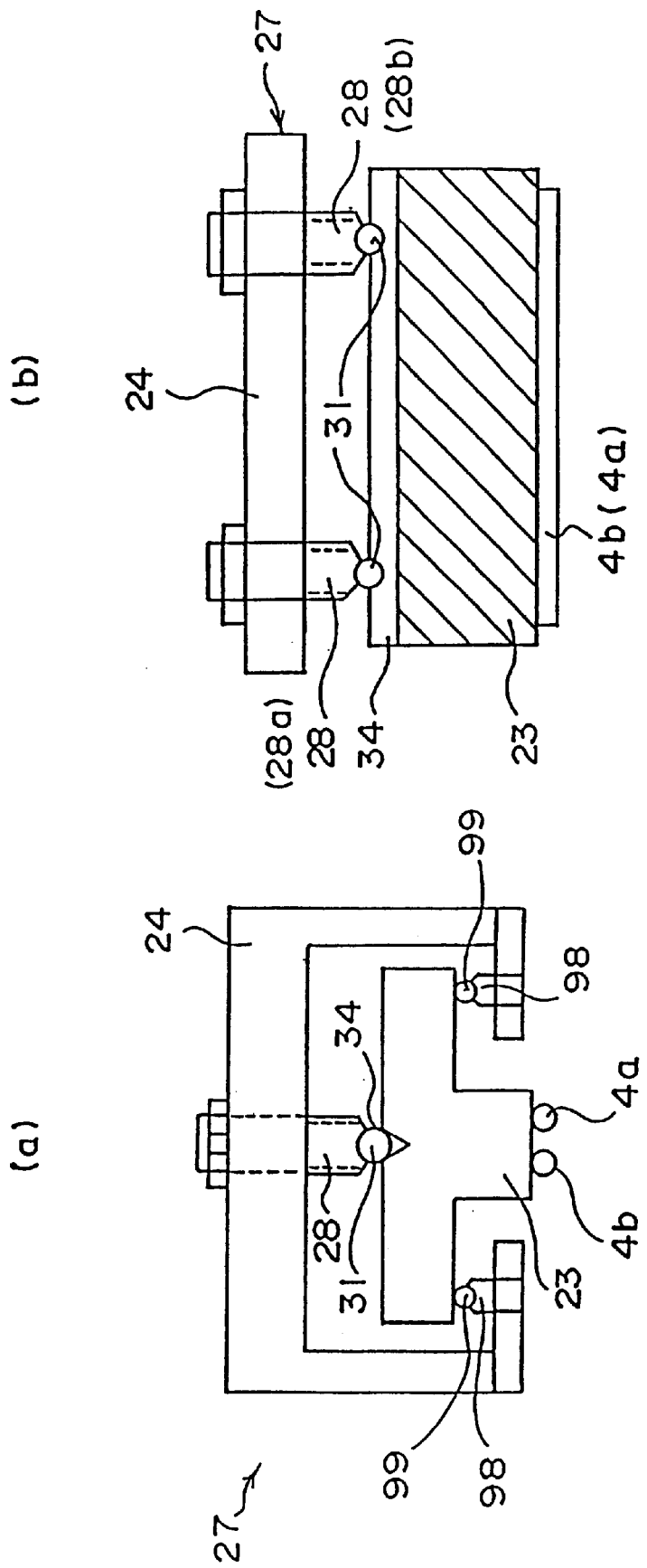
FIG. 10 is a view showing further another preferred embodiment of the slide mechanism.

A slide mechanism 27 illustrated in FIG. 10 supports the upper side of the fulcrum member retaining portion 23, as in the case of FIG. 9, while securing the horizontal balance in the forward and backward direction (the direction connecting the balls 31 and 31 of a pair of ball plungers 28 and 28) by placing the ball 31 of the ball plunger 28 in the V-shaped groove 34 secured on the upper surface of the fulcrum member retaining portion 23. Further, ball plungers 98 and 98 which support the left and right sides of the fulcrum member retaining portion 23 from the lower side are provided at the load applying drive body 24 side. These ball plungers 98 and 98 press the fulcrum member retaining portion 23 upwards and support the portion 23 while securing the left and right balance thereof, by the balls 99 and 99 utilizing a press force of a compression spring secured in each of the corresponding ball plungers 98 and 98. In an actual cleaving work, in which the slide mechanism illustrated in FIG. 10 is used, the fulcrum members 4a and 4b are pressed upward from the semiconductor wafer 1 side. Therefore, the ball 31 of the ball plunger 28 is further contracted against the inner compression spring. In the mechanism illustrated in FIG. 10, the fulcrum member retaining portion 23 can autonomously maintain the left-right balance in the forward and backward direction, and will cause dynamic load to operate from the fulcrum members 4a and 4b onto the semiconductor wafer 1.

The above load applying means 24 illustrated in FIG. 1 is provided so as to freely move vertically while being guided by a guide means (not illustrated). In FIG. 1, an arm 35 is attached and fixed at the upper part side of the load applying means 24 in such a manner that the arm can be elongated in a lateral direction. A stopper block 36 is disposed and fixed on the platform 10 just below the arm 35 with spacing. And, a load cancelling spring 26, which is compressed, intervenes between the arm 35 and the stopper block 36, wherein the load applying means 24 is always pressed upward by a pressing force of the load cancelling spring 26.

In the preferred embodiment shown in FIG. 1, an operating portion 37 is secured at the upper end of the load applying means 24. By manually pressing the operating portion 37 against the pressing force of the load cancelling spring 26, the fulcrum members 4a, 4b, 6a and 6b apply fulcrum forces to the semiconductor wafer 1, whereby the semiconductor wafer 1 is cleaved along the scribing mark 2. In addition, by cancelling the pressing force of the operating portion 37, the load applying means 24 is pressed up by the load cancelling spring 26 and is returned to the fixed position before being pressed down.

The above stroke setting means 25 is composed of an arm 35, a stopper block 36, and a stopper screw 38. The stopper screw 38 is screwed in the arm 35 so that the stopper screw 38 can freely advance and retreat. By adjusting the screwed position of the stopper screw 38 in the advancement and retreating positions, the interval between the lower end of the stopper screw 38 and the stopper block 36 is varied. Therefore, the load applying means 24 is capable of adjusting the stroke (moving range) in the vertical movement.

An observation means in which a camera 40 is used is attached to the position facing the setting area of the above semiconductor wafer 1. The camera 40 is mounted at a supporting arm 41. The base side of the supporting arm 41 is fixed on the platform 10. In the preferred embodiment, the relative positioning between the corresponding fulcrum members and the semiconductor wafer 1, that is, moving control of the moving stage means 14, can be carried out on the basis of the picture image picked up by the camera 40. In the controlling method, first, the picture image picked up by the camera 40 is analyzed to secure a relative positional deviation between the corresponding fulcrum members and the semiconductor wafer 1. And, the moving distance of the moving stage means 14 is automatically controlled so that the secured positional deviation becomes zero. Or, the respective moving amounts of the moving stage means 14 may be manually controlled so that the above secured positional deviation becomes zero.

An apparatus according to the preferred embodiment is constructed as described above. Next, a description is given of a cleaving method of semiconductor wafer 1 using the apparatus. First, a damper member 39 is placed on the wafer setting plate 13 so as to cover the opening secured on the corresponding wafer setting plate 13. Next, a semiconductor wafer 1 on which scribing marks 2 are inscribed is placed in the corresponding opening of the wafer setting plate 13 from the upside of the damper member 39. And, the semiconductor wafer 1 is positioned and set with respect to the fulcrum members 6a and 6b. As shown in FIG. 2 and FIG. 3, the fulcrum members 6a and 6b on the wafer setting plate 13 are set so as to become parallel to and left-right symmetrical centering around the scribing marks 2 of the semiconductor wafer 1. The semiconductor wafer 1 is set by automatically or manually controlling to move the moving stage means 14 while observing the picture image of the camera 40.

Next, observing the picture image of the camera 40, movements in the X, Y and θ directions of the moving stage means 14 so that, as shown in FIG. 2 and FIG. 3, the fulcrum members 4a and 4b at the fulcrum member retaining means 23 side becomes parallel to and left-right symmetrical centering around the scribing marks 2, whereby the positioning with respect to the semiconductor wafer 1 and the fulcrum members 4a and 4b are carried out. And, after the positioning is finished, a damper member 39 is placed on the semiconductor wafer 1 to further cover the semiconductor wafer 1, and the operating portion 37 it is pressed down.

Thereby, the fulcrum members 4a and 4b are brought into contact with the upper side of the semiconductor wafer 1. At this time, the ball 31 is in a state protruded downward from the holder 32 by a pressing force of the ball press-down spring 29. If the operating portion 37 is further pressed down, the ball 31 is contracted to the receiving position of the holder 32 as shown in FIG. 7 through FIG. 10, wherein the press-down force is directly given to the semiconductor wafer 1. At this time, as shown in FIG. 2 and FIG. 3, fulcrum forces P2, P1,F2 and F1 are caused to operate from the fulcrum members 4a, 4b, 6a and 6b onto the semiconductor wafer 1. The relationship between these fulcrum forces is P1=P2=F2=F1. If the operating portion 37 is further pressed down, the semiconductor wafer 1 reaches a point of breakage, and the semiconductor wafer 1 is cleaved along the scribing marks 2.

Figure 4:
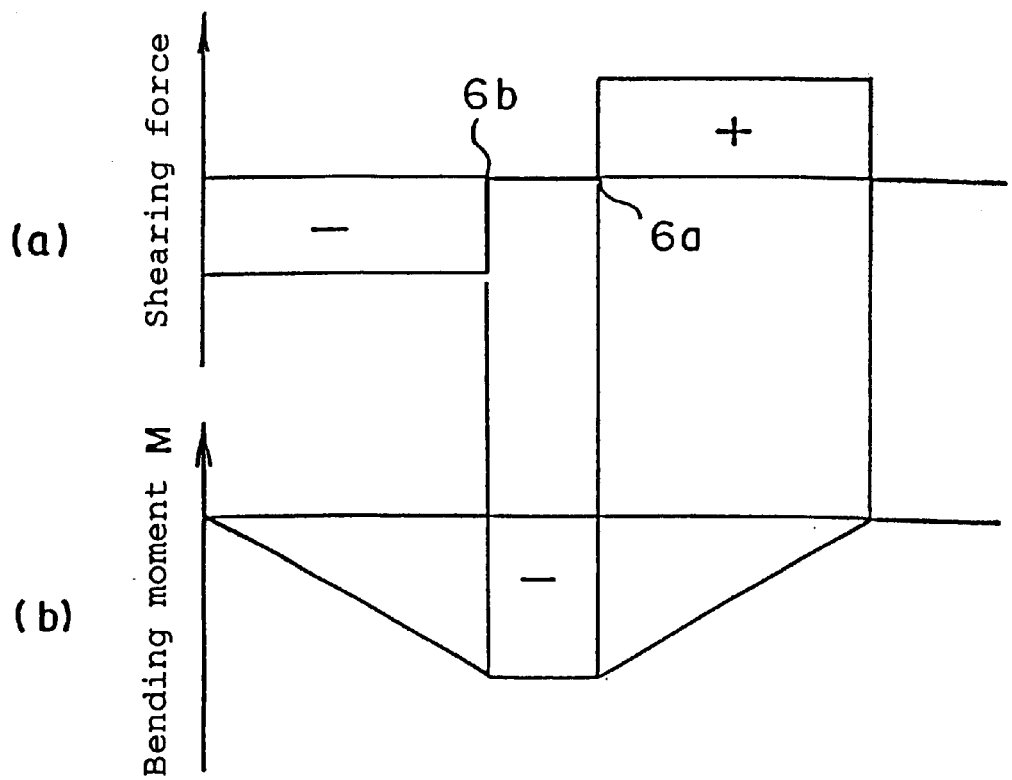
FIG. 4 is a view showing the relationship between the shearing force and bending moment, when cleaving a semiconductor wafer, in the preferred embodiment.

FIG. 4 shows the relationship between a shearing force and a bending moment when cleaving the semiconductor wafer 1 in the preferred embodiment. In the preferred embodiment, both a pair of upper fulcrum members 4a and 4b and another pair of lower fulcrum members 6a and 6b are disposed left-right symmetrically centering around the scribing marks 2. By the "four-point bending method" utilizing these fulcrum members 4a, 4b, 6a and 6b, the semiconductor wafer 1 is thus cleaved. Therefore, as shown in FIG. 4(a), the shearing force becomes zero between the fulcrum members 6a and 6b between the scribing marks 2 placed at the innermost side, and as shown in FIG. 4(b), the bending moment becomes a fixed maximum value in the range in which the shearing force becomes zero.

Figure 5:
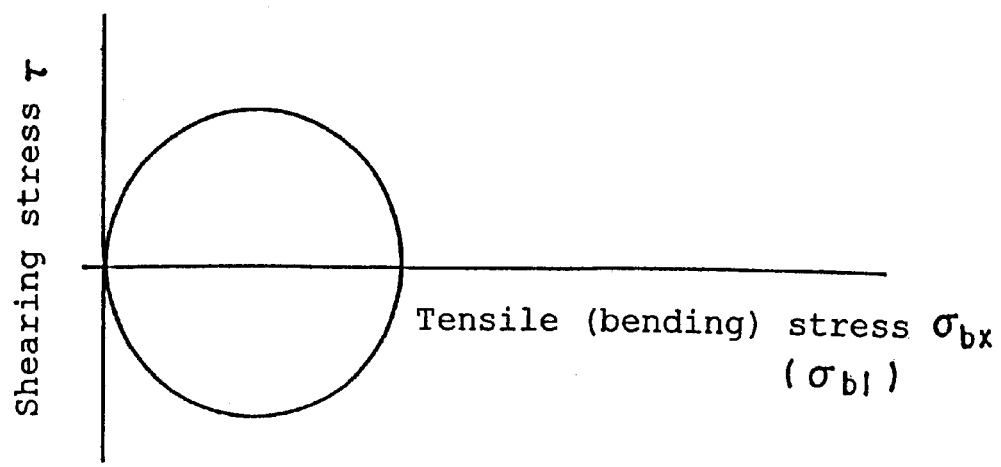
FIG. 5 is a view of Mohr's stress circle showing the relationship between the shearing stress and tensile stress, when cleaving a semiconductor wafer, in the preferred embodiment.

In this state, as shown in FIG. 3, a minute cubic volume dvb at one half side of the scribing mark 2 is taken for instance, no shearing stress operates on the vertical cleaving plane of the scribing mark 2 but only the bending tensile stress σx is allowed to operate thereon. Further, if the relationship between the shearing stress and bending tensile stress at the rear of the scribing mark 2 is expressed in terms of Mohr's stress circle, it will become as shown in FIG. 5. That is, the shearing stress τ becomes zero between the fulcrum members 6a and 6b, wherein the maximum main stress σbx of the bending tension is produced in the direction (X direction) perpendicular to the ideal vertical cleaving plane of the scribing mark 2.

Therefore, according to the invention, an area where the shearing stress becomes zero and the X direction becomes a direction of the maximum main stress can be produced in a comparatively wide range at both sides of the scribing mark 2. For this reason, the semiconductor wafer 1 can be cleaved so as to have an ideal vertical cleaving plane along the scribing mark 2. Thus, as described above, excellent effects can be brought by the construction of the preferred embodiment.

In addition, as described above, since an area where the shearing stress becomes zero can be secured in a comparatively wide range at both sides of the scribing mark 2, the scribing mark 2 can be accommodated between the fulcrum members where the shearing stress becomes zero even though the fulcrum members and the scribing mark 2 move out of parallelism more or less. Thereby, the semiconductor wafer 1 will be cleaved by only the bending tensile stress (pure tensile stress) in the X direction. Resultantly, the cleaved plane is made free from becoming oblique or bent, and a good quality vertical cleaved plane can be obtained. Therefore, it becomes easy to position the fulcrum members and semiconductor wafer 1 (scribing mark 2), wherein the cleaving efficiency can be sufficiently increased.

Moreover, in the preferred embodiment, a damper means 39 is provided between the upper surface of the semiconductor wafer 1 and fulcrum members in the preferred embodiment, a damper means 39 is provided between the upper surface the semiconductor wafer 1 and fulcrum members and between the lower side of the wafer 1 and fulcrum members. Accordingly, for examples even though a semiconductor wafer 1 is made of a glass wafer which is likely to be broken, the fulcrum force operating from the respective fulcrum members onto the semiconductor wafer 1 can be reduced. So, it becomes possible to prevent the semiconductor wafers 1 from being damaged or broken. In addition, since semiconductor wafers 1 are cleaved in a state where it is placed between damper means 39, it is possible to prevent the semiconductor wafers 1 from being scattered when cleaving.

In addition, in the preferred embodiment, a fulcrum member retaining portion 23 having fulcrum members 4a and 4b which support the upper side of the semiconductor wafer 1 is coupled to the load applying means 24 via such a slide mechanism as shown in FIG. 7 through FIG. 10. Therefore, a fulcrum force is caused to operate onto a semiconductor wafer 1 by a fixed and uniform load free from any load fluctuation while horizontally maintaining the fulcrum member retaining portion 23, that is, while horizontally maintaining the hypothetical line connecting the lower ends of the fulcrum members 4a and 4b.

That is, for example, it is assumed that the upper surface of the semiconductor wafer 1 and the opposite surface of the fulcrum member retaining portion 23 suspended and retained by the tension spring 30 move out of parallelism more or less, and the fulcrum members 4a and 4b are first one-sidedly brought into contact with the upper surface of the semiconductor wafer 1 (in further detail, the upper surface of the upper damper means 39 of the semiconductor wafer 1). Since the ball 31 protrudes downward from the holder 32 by the ball press-down spring 29, the fulcrum member retaining portion 23 pushes the ball 31 into the holder 32 side against the ball press-down spring 29 by the load applying means 24 being further pressed downward. In line therewith, the fulcrum member retaining portion 23 is turned so that it becomes parallel to the plane of the semiconductor wafer 1, that is, in a direction along which the entire length of the fulcrum members 4a and 4b is brought into contact with the plane of the semiconductor wafer 1, wherein the fulcrum member retaining portion 23 will be pressed down while maintaining that the pressing plane of the fulcrum member retaining portion 23 is in parallel to the upper surface of the semiconductor wafer 1. Thereby, a fulcrum force of a fixed load is applied from the fulcrum members 4a and 4b to the semiconductor wafer 1, whereby the semiconductor wafer 1 can be cleaved.

Also, although the fulcrum member retaining portion 23 is further additionally pressed down after the semiconductor wafer 1 is cleaved, the ball press-down spring 29 is elongated at the moment when the cleaving is finished, wherein the ball 31 is separated from the ball receiving plane of the holder 32 and protrudes therefrom, whereby a feature for lighting fluctuation load is caused to operate on the ball press-down spring 29. Therefore, even though the fulcrum member retaining portion 23 is additionally pressed down after a cleavage is completed, it will become possible to prevent the semiconductor wafer 1 from being overloaded.

Figure 19:
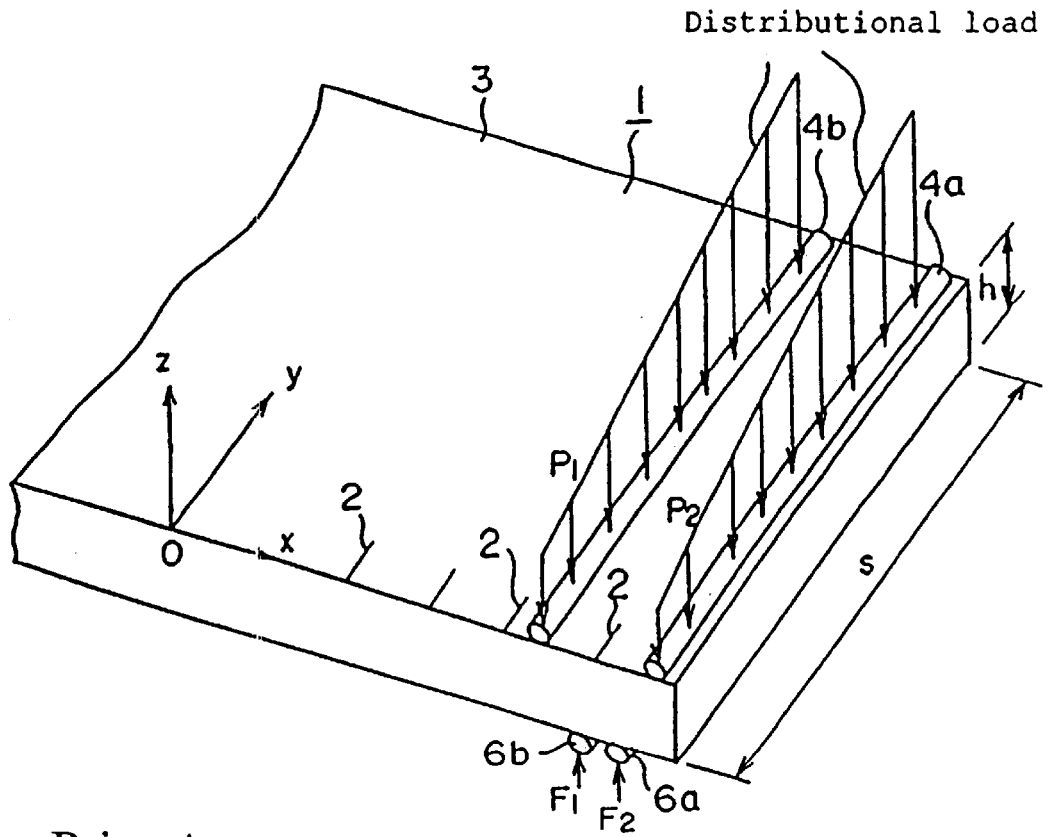
FIG. 19 is an explanatory view of major parts of still another preferred embodiment of the invention.

FIG. 19 shows major parts of another preferred embodiment according to the invention. A feature of the preferred embodiment exists in that fulcrum forces P2 and P1 applied from the fulcrum members 4a and 4b to the semiconductor wafer 1 are applied by distributional forces. All other parts are identical to those of the previously described embodiment.

Figure 18:
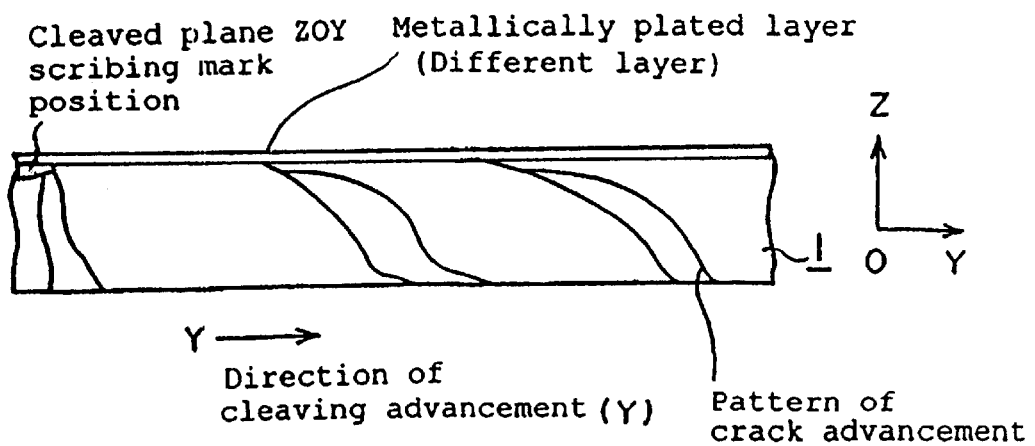
FIG. 18 is an explanatory view showing a state of advancement of cleaving of a semiconductor wafer in which a complex layer such as metallic plating, etc., is formed on the scribing mark formed plane.

There are some semiconductor wafers 1 in which a complex material layer such as metallic plating, etc., is formed on the formed plane of the scribing mark 2. If the semiconductor wafer 1 on which such a metallic plating, etc., is formed, is cleaved along a scribing mark 2, the metallically plated plane side is difficult to be cleaved, as shown in FIG. 18, when a crack develops in a direction elongating line of the scribing mark 2 secured at one end edge side. For this reason, the crack development on the metallically plated plane side is delayed from the opposite plane (the plane on which no metallic plating, etc., is formed), such a problem arises, by which a defective cleaving portion is likely to occur.

In order to solve such a problem, in the construction shown in FIG. 19, fulcrum forces P2 and P1 are applied to the semiconductor wafer 1 via fulcrum members 4a and 4b in a form of distributional load described below. That is, the intensity of the fulcrum forces P2 and P1 is gradually increased in a direction along which a crack develops toward the elongated line of the scribing mark 2 from the scribing mark 2. Application of the fulcrum forces in a form of distributional load can be achieved by further increasing the press-down spring force of the ball 31 of the ball plunger 28b at the opposite side than in the press-down spring force of the ball 31 at the side where the scribing mark 2 is formed, among two ball plungers 28a and 28b shown in, for example, FIG. 10(b).

Thus, by gradually increasing the fulcrum forces along the direction of advancement of the crack, a bending tensile force for cleaving the plane where the metallic plating, etc., is formed will be gradually increased along the direction of advancement of the crack. Therefore, delay of crack development can be solved at the plane where the metallic plating, etc., is formed, whereby even in a semiconductor wafer 1 having a complex material layer such as a plating, etc., formed at the plane where the scribing mark 2 is formed, it will become possible to obtain a good quality cleaved plane in a stabilized manner.

Next, a description is given of a detailed embodiment of the invention. An experiment in cleaving a semiconductor wafer 1 was carried out by using an apparatus shown in FIG. 1, wherein conditional parameters showing the relationship between the semiconductor wafer 1 illustrated in FIG. 2 and FIG. 3 and fulcrum members 4a, 4b, 6a and 6b are established as described below.

The length of a scribing mark 2 of the semiconductor wafer 1 was set to 500 $\mu$m, and the scribing marks 2 were arrayed and disposed in parallel to each other at a pitch of 0.8 mm at one end edge on the surface of the semiconductor wafer 1. The width S of the semiconductor wafer 1 was 6 mm, and the height (thickness) h thereof was 0.12 mm. The upper fulcrum members 4a and 4b were disposed in parallel to each other and left-right symmetrically centering around the scribing mark 2 while the interval b between the fulcrum members 4a and 4b was 1.4 mm.

Further, the lower fulcrum members 6a and 6b were disposed in parallel to each other and left-right symmetrically centering the scribing mark 2 while the interval a between the fulcrum members 6a and 6b was 0.14 mm. These upper and lower fulcrum members 4a, 4b, 6a and 6b are formed to be circular rod-shaped (columnar rod) while the diameter of fulcrum members 4a and 4b was 0.5 mm and that of the fulcrum members 6a and 6b was 0.125 mm.

A vinyl sheet 60 $\mu$m thick or so intervenes, as a damper means, between the upper surface of the semiconductor wafer 1 and the fulcrum members 4a and 4b, and between the lower side of the semiconductor wafer 1 and the fulcrum members 6a and 6b. Thus, in a state where the damper means intervenes between the semiconductor wafer 1 and the fulcrum members, cleavage of the semiconductor wafer 1 was carried out by applying a fixed load by which a fulcrum force of P1=P2=F1=F2=50 gf is caused to operate onto the respective fulcrum members.

As a result, an ideal vertical cleaved plane which is mirror-finished and vertical could be obtained on the upper side and lower side of the semiconductor wafer 1 along the scribing mark 2. Further, by providing the damper means and preventing fulcrum forces from being directly applied to the semiconductor wafer 1 from the fulcrum members, no damages such as impairments could be found in the semiconductor wafer 1.

In addition, the inventor changed the interval b between the fulcrum members 4a and 4b to 1 mm of the condition described above, and changed the fulcrum force of the respective fulcrum members to 100 gf, wherein a cleaving experiment of a semiconductor wafer 1 was carried out as in the above. In the experiment, satisfactory results could be obtained in this experiment, too. Further, parameters such as the length, depth, etc., of the scribing marks 2 are appropriately established so that they becomes optimal conditions, through the cleaving experiments.

The invention is not limited to the preferred embodiments and examples, but may be subjected to various modifications. For example, in the above example, the scribing marks 2 are provided at one end edge of the semiconductor wafer 1. However, the scribing marks 2 may be continuously provided from one end to the other end on the surface of the semiconductor wafer 1.

Figure 11:
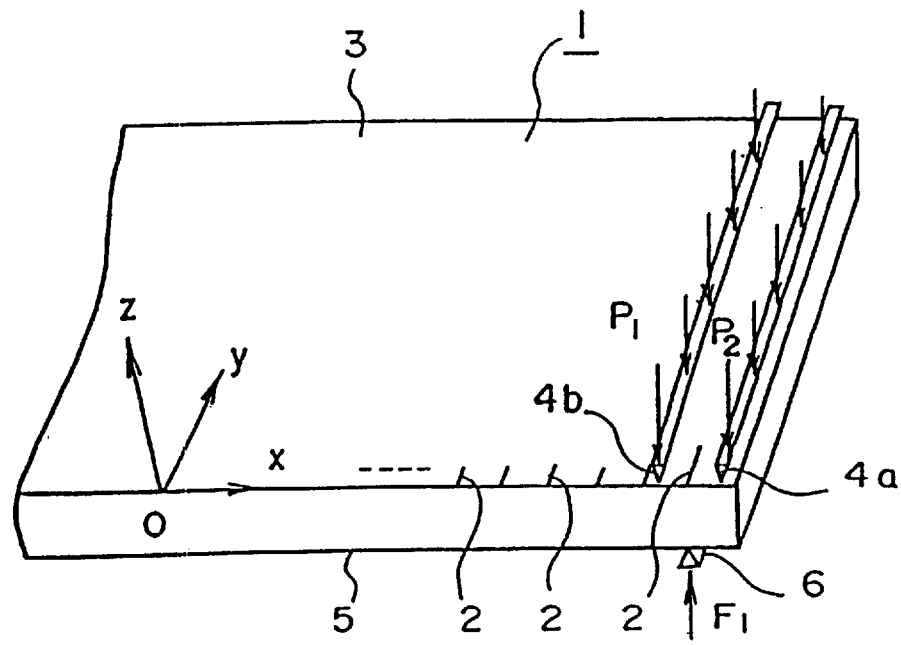
FIG. 11 is a view showing a prior art example of a semiconductor wafer cleaving method.
Figure 12:
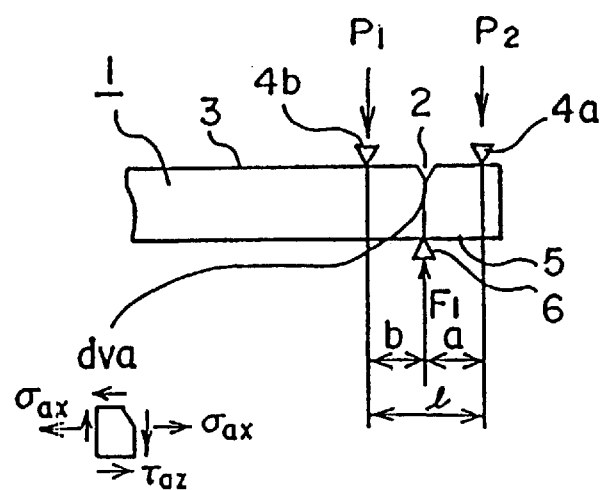
FIG. 12 is a longitudinally sectional view of a portion of a scribing mark in FIG. 10.
Figure 13:
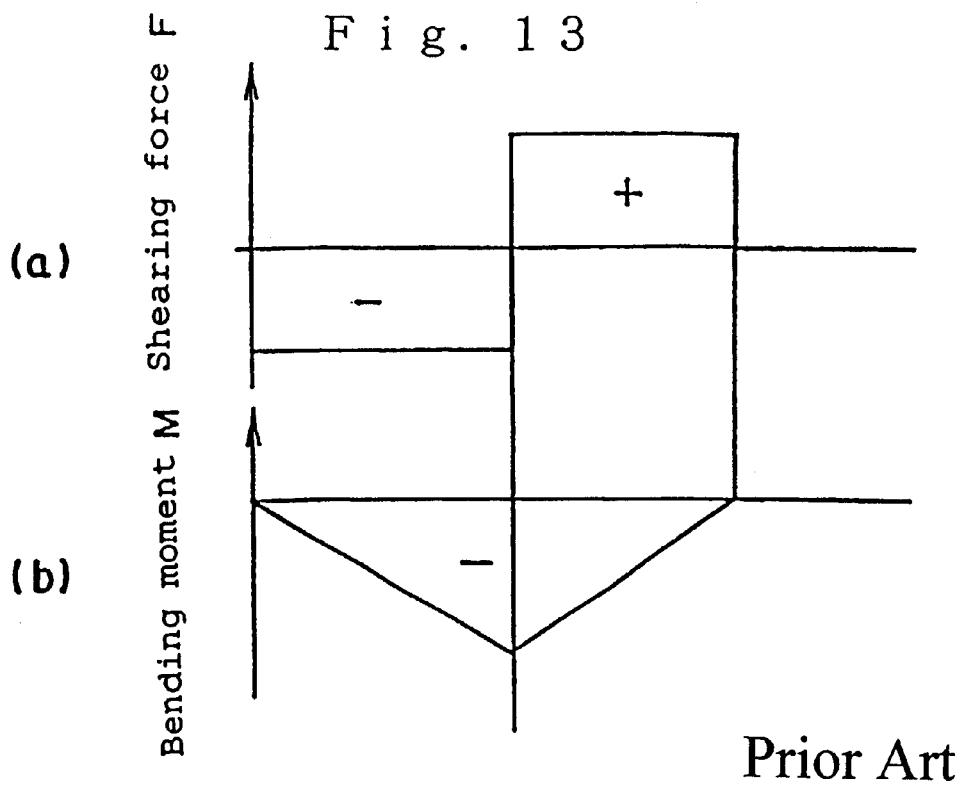
FIG. 13 is a view showing the relationship between a shearing force and bending moment in a conventional cleaving of a semiconductor wafer.
Figure 14:
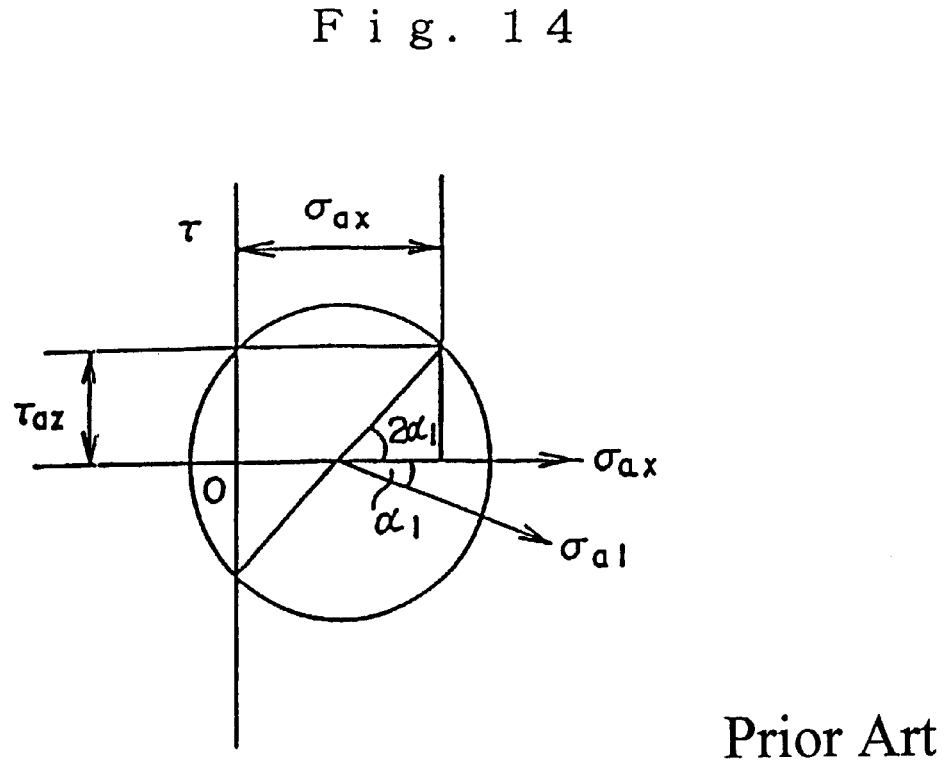
FIG. 14 is a view of Mohr's stress circle showing the relationship between the shearing stress and tensile stress in a conventional cleaving of a semiconductor wafer.
Figure 15:
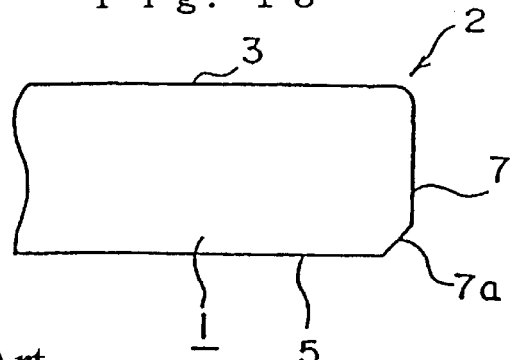
FIG. 15 is an explanatory view showing a defective example in which an oblique plane is produced on a cleaved plane.
Figure 16:
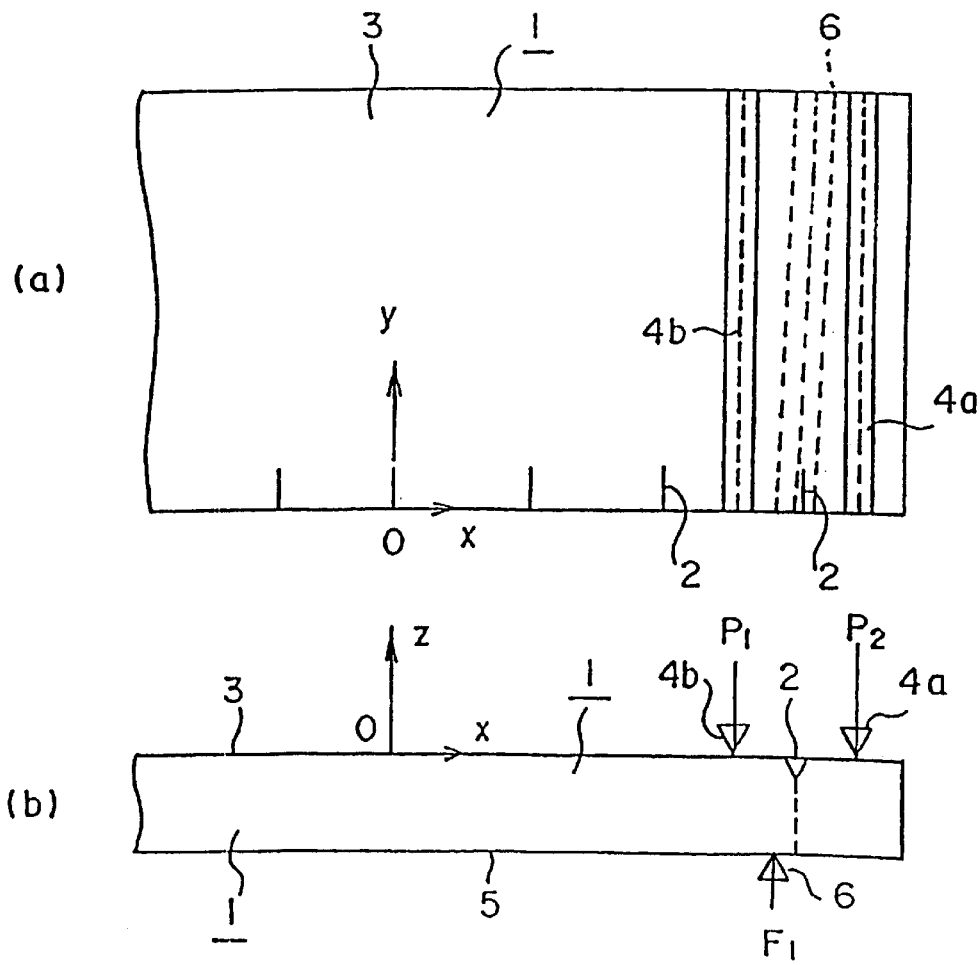
FIG. 16 is an explanatory view showing a defective example in which fulcrum members 6 are disposed in non-parallel to a scribing mark 2.
Figure 17:
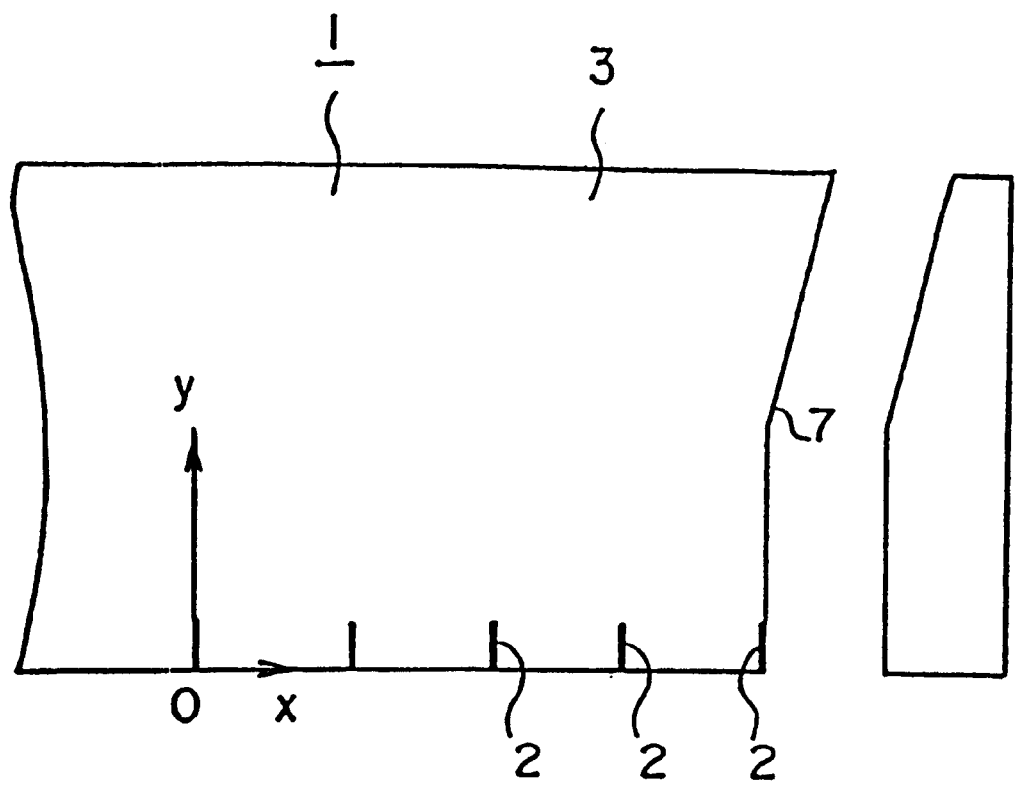
FIG. 17 is an explanatory view showing an example of bending on a cleaved plane, which is produced where a semiconductor wafer is cleaved in a state illustrated in FIG. 15.

In addition, the shape of the fulcrum members may be a member, the cross section of which is triangular as shown in, for example, FIG. 11, other than the circular rod. That is, the cross section is not particularly limited.

Also, in the above example, four fulcrum members were used, two of which are located on the upper side of the semiconductor wafer 1, and the other two of which are located on the lower side thereof. However, four or more fulcrum members maybe used, for example, two or more fulcrum members (preferably, even numbers of one or more pairs) are used on the upper side, and two or more fulcrum members (preferably, even numbers of one or more pairs) are used on the lower side. In this case, it is necessary that load is applied to the respective fulcrum members so that the shearing stress becomes zero at an area of the semiconductor wafer 1 between the fulcrum members where the scribing marks 2 are placed at the innermost side.

Figure 6:
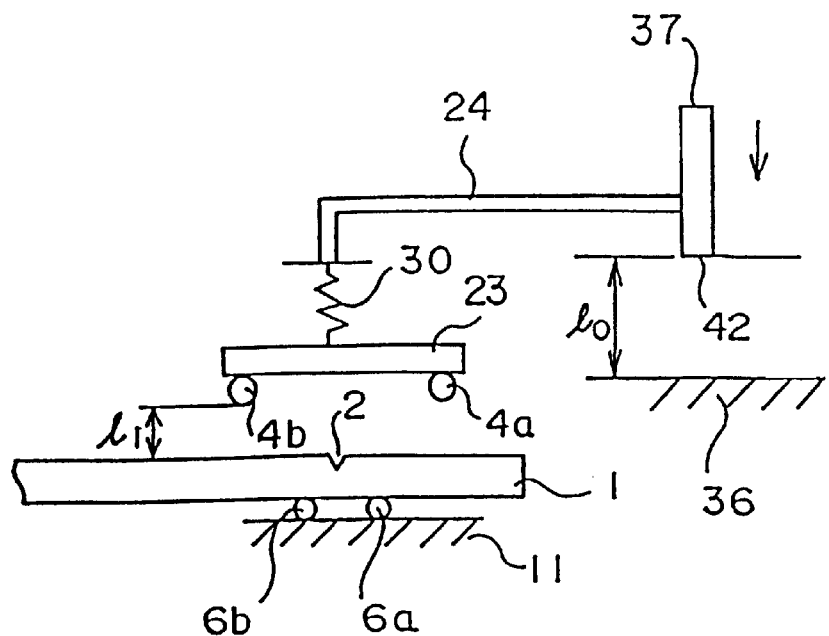
FIG. 6 is a view showing another preferred embodiment of a semiconductor wafer cleaving apparatus.

Moreover, where the fulcrum member retaining portion 23 is connected to the load applying means 24 via the slide mechanism 27, the slide mechanism 27 may be composed of only a tension spring 30 as shown in FIG. 6, wherein the ball plunger 28 shown in FIG. 7, etc., may be omitted. In FIG. 6, the lower end of the load applying means 24 opposed to the operating portion 37 is made into a stopper 42, wherein in a state where the load applying means 24 is at a fixed position before being pressed down, the distance $l_0$ (the pressing-down stroke of the load applying means 24) between the stopper 42 and the upper surface of the stopper block 36 is set to be greater than the distance $l_1$ between the upper side of the semiconductor wafer 1 and the lower end of the fulcrum members 4a and 4b.

In the case of the apparatus illustrated in FIG. 6, the fulcrum member retaining portion 23 is supported by the tension spring 30 and is rotatable (inclinable). At this standpoint, even-though the load applying means 24 is pressed down and one-sidedly brought into contact with the semiconductor wafer 1 via the fulcrum members at the beginning, the fulcrum member retaining portion 23 is turned so as to become parallel to the upper side of the semiconductor wafer 1 as the load applying means 24 is further pressed down. And, since the fulcrum member retaining portion 23 is pressed down while maintaining the parallel state, a fixed stable load can be applied onto the semiconductor wafer 1 via the fulcrum members 4a and 4b.

Moreover, the tension spring 30 is elongated at the movement when the semiconductor wafer 1 is cleaved, and functions so as to absorb a reaction from the semiconductor wafer 1. For this reason, even though the fulcrum member retaining portion 23 is pressed down until the load applying means 24 is brought into contact with the stopper block 36, the semiconductor wafer 1 can be prevented from an excessive fulcrum force being given thereto.

Further, in the above example, a moving load is given from the fulcrum members 4a and 4b on the upper side of the semiconductor wafer 1 to the semiconductor wafer 1. However, the moving load may be given from the fulcrum members 6a and 6b on the lower side thereof. Or, the moving load may be given to the semiconductor wafer from the fulcrum members on both the upper side and lower side of the wafer 1.

Further, although the damper means 39 is provided on both the upper side and lower side of the semiconductor wafer 1 in the above example, the damper means 39 can be omitted if damage due to the fulcrum force on the semiconductor wafer 1 does not particularly constitute any problem.

Moreover, in the apparatus shown in FIG. 1 or FIG. 2, although an operating portion 37 is provided at the load applying means 24, and the operating portion 37 is designed so as to be manually pressed down, the load applying means 24 may be designed so as to be automatically pressed down. In this case, for example, the load applying means 24 is coupled to a motor via a converter which converts rotations of the motor in an advancement and retreating movement, wherein by controlling the rotations of the motor by a control device, it is possible to automatically control the pressing down movement of the load applying means 24.

Also, a kind of camera 40 is provided in the observation means in the above example, a plurality of cameras having various magnifications may be provided instead thereof. For example, a camera having a low magnification ratio and a camera having a high magnification ratio are provided. In this case, rough positioning is quickly carried out by the camera of a low magnification ratio, and next, fine positioning can be carried out by the camera of a high magnification ratio. If so, the positioning work with respect to the semiconductor wafer 1 and the fulcrum members can be efficiently performed.

INDUSTRIAL APPLICABILITY

As described above, a semiconductor wafer cleaving method and an apparatus, according to the invention, are suitable for cleaving semiconductor wafers, that is, universal wafers made of various materials such as silicone wafers, glass wafers, etc.

What is claimed is:

1. A semiconductor wafer cleaving apparatus comprising: a wafer setting plane for placing and setting a semiconductor wafer which has scribing marks inscribed on surface, the semiconductor wafer having an upper side and a lower side; a moving stage means which is capable of moving the semiconductor wafer set on the wafer setting plane in X and Y directions of two planar axes, orthogonal to each other and a rotation direction around a Z axis perpendicular to the plane XY; lower side fulcrum members for supporting the lower side of the semiconductor wafer placed on said wafer setting plane in parallel to a scribing mark in at least two or more positions in a state where the scribing mark is placed therebetween; upper side fulcrum members for supporting the upper side of the semiconductor wafer set on said wafer setting plane in parallel to said scribing mark in at least two positions different from the positions of said lower side fulcrum members such that the scribing mark is placed therebetween, the lower fulcrum members disposed closer to said scribing mark than said upper side fulcrum members; a dynamic load applying means for applying a moving load providing said fulcrum force from at least one of both said upper side and lower side fulcrum members to the semiconductor wafer; and an observing means provided with a camera for observing a supporting condition of the semiconductor wafer supported by both said upper side and lower side fulcrum members;

wherein said fulcrum force which makes zero a shearing force on the semiconductor wafer between the fulcrum members to support an innermost side with the scribing mark placed therebetween is applied from the respective fulcrum members at both the upper side and lower side to the semiconductor wafer, and pure bending tensile stress is caused to operate onto said scribing mark, whereby said semiconductor wafer is cleaved said scribing mark.

2. A semiconductor wafer cleaving apparatus as set forth in claim 1, comprising a slide mechanism for connecting said respective fulcrum members to said dynamic load applying means, the connection such that fulcrum tip ends of said respective fulcrum members on the semiconductor wafer are parallel to a plane where said fulcrum force on the semiconductor wafer is applied.

3. A semiconductor wafer cleaving apparatus as set forth in claim 1, comprising a damper member for receiving at least a portion of the semiconductor wafer after a cleaving operation.

* * * * *